United States Patent [19]

Hayashi

[11] Patent Number: 4,998,665

[45] Date of Patent: Mar. 12, 1991

[54] BONDING STRUCTURE OF SUBSTRATES AND METHOD FOR BONDING SUBSTRATES

[75] Inventor: Yoshihiro Hayashi, Tokyo, Japan

[73] Assignee: NEC Corporation, Japan

[21] Appl. No.: 401,980

[22] Filed: Sep. 1, 1989

[30] Foreign Application Priority Data

Sep. 7, 1988 [JP] Japan .................. 63-225226

[51] Int. Cl.$^5$ ............. H01L 21/50; H01L 21/58; H05K 3/34
[52] U.S. Cl. ................ 228/180.1; 228/254; 228/123; 357/65; 437/209
[58] Field of Search ............ 228/180.2, 180.1, 254, 228/123; 357/65; 437/209

[56] References Cited

U.S. PATENT DOCUMENTS

| 3,373,481 | 3/1968 | Lins et al. | 228/180.2 |
| 3,778,530 | 12/1973 | Reimann | 228/180.2 |
| 4,176,443 | 12/1979 | Iannuzzi et al. | 228/180.2 |
| 4,605,153 | 8/1986 | Van Den Breckel et al. | 228/180.2 |
| 4,818,728 | 4/1989 | Rai et al. | 228/180.2 |
| 4,836,435 | 6/1989 | Napp et al. | 228/180.2 |

Primary Examiner—Sam Heinrich
Attorney, Agent, or Firm—Laff, Whitesel, Conte & Saret

[57] ABSTRACT

First and second substrates are provided with a projection of a high melting point conductive material and an aperture filled at the bottom plane with a low melting point conductive material, respectively. The projection of the first substrate is plunged into the low melting point conductive material which is molten in the aperture by heating, so that the projection and the low melting point conductive material are bonded mechanically and electrically by cooling.

4 Claims, 4 Drawing Sheets

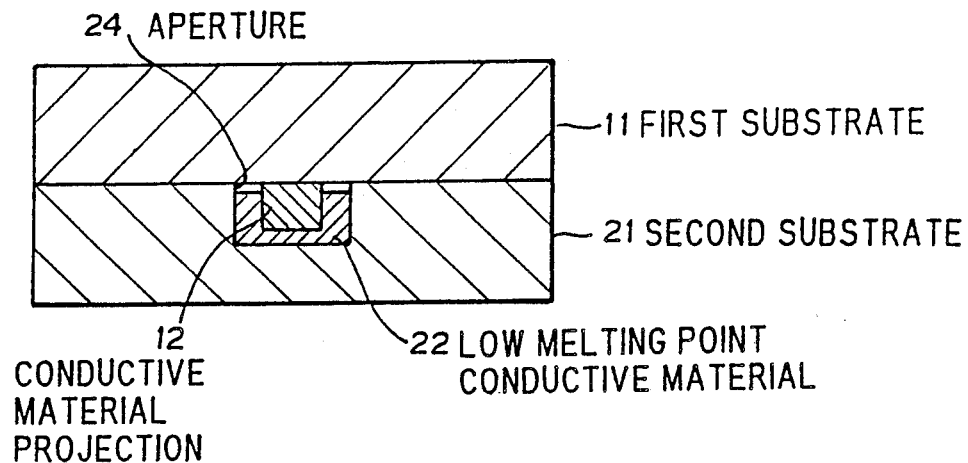
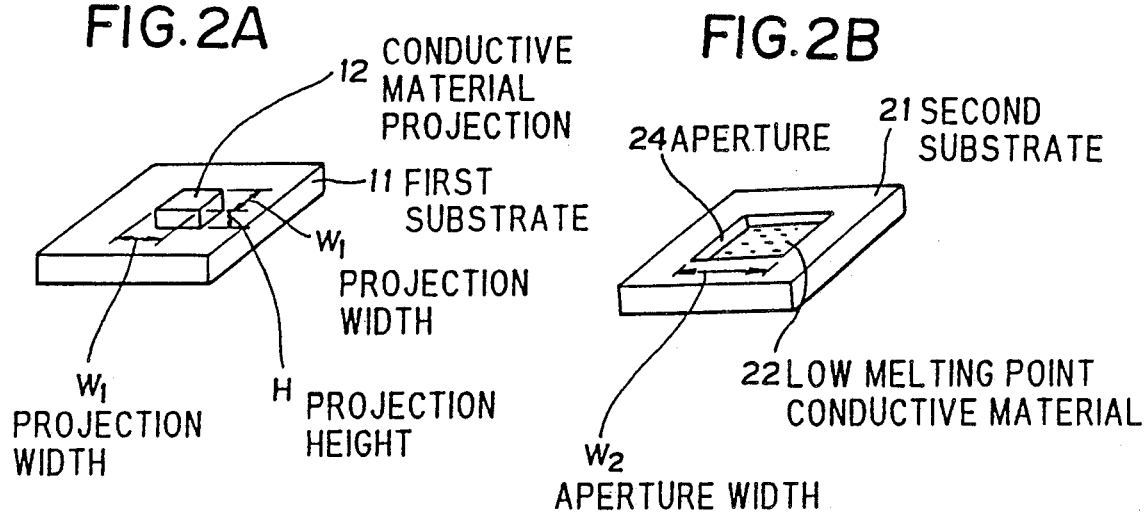
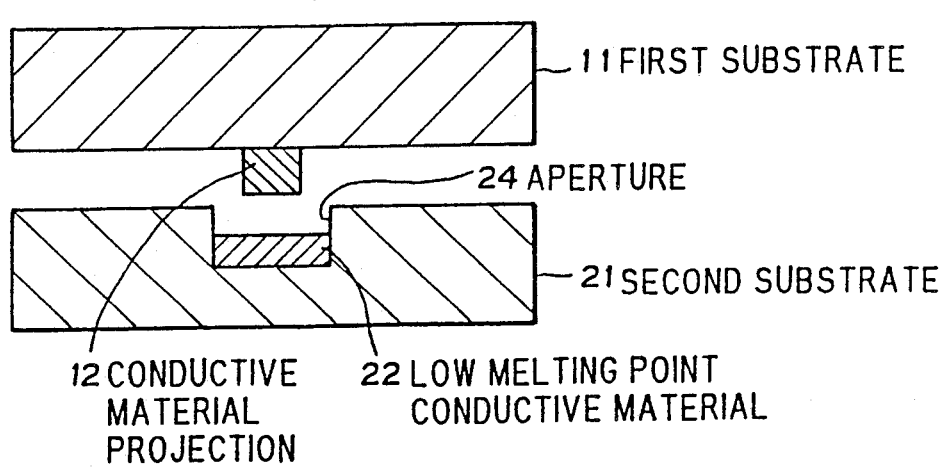

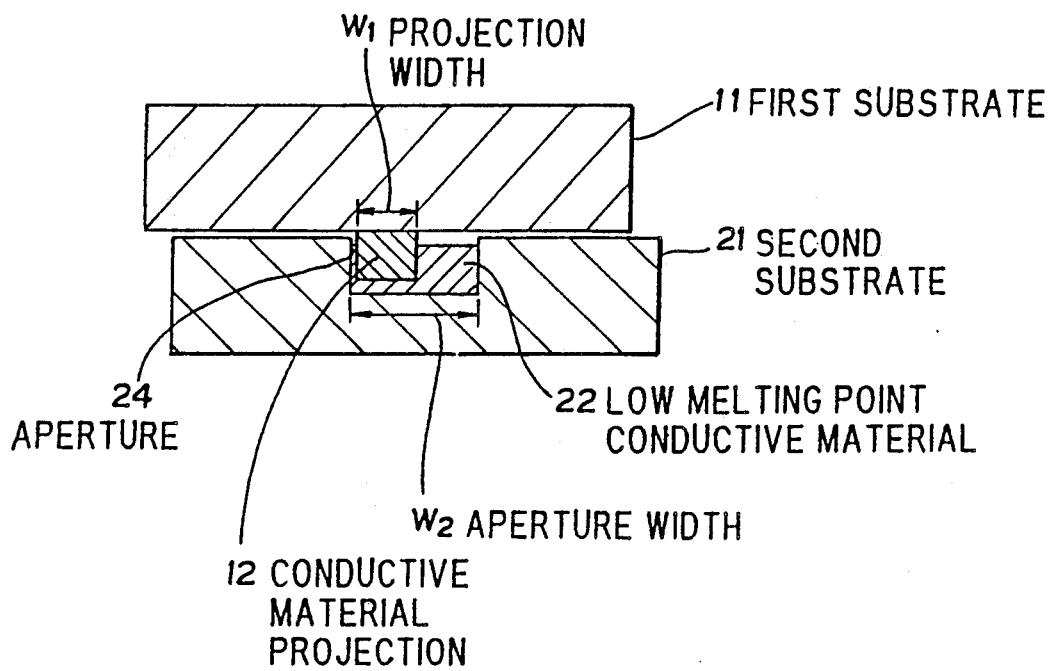
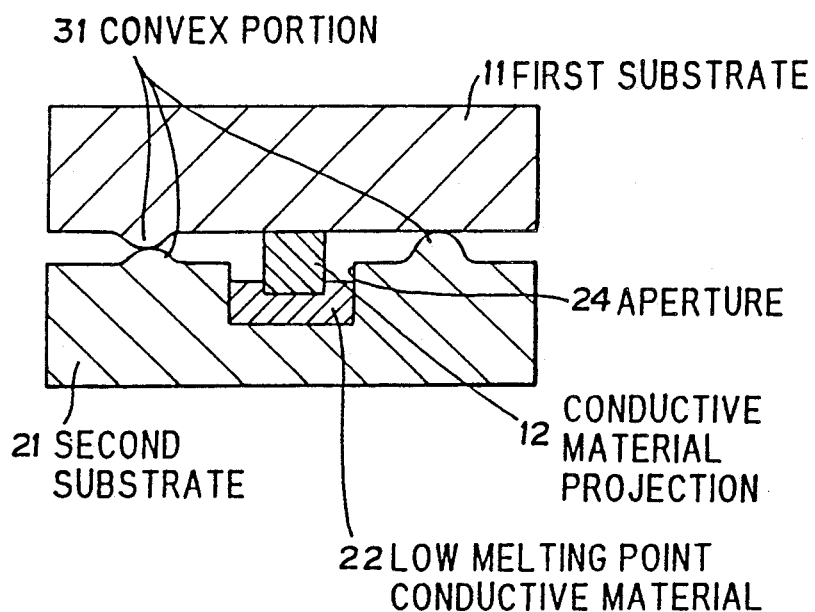

4,998,665

BONDING STRUCTURE OF SUBSTRATES AND METHOD FOR BONDING SUBSTRATES

FIELD OF THE INVENTION

The invention relates to a bonding structure of substrates and a method for bonding substrates, and more particularly to a bonding structure of first and second substrates and a method for bonding first and second substrates in which the first and second substrates having circuit elements such as transistors on the surfaces thereof are bonded to provide the electric connection of the circuit elements.

BACKGROUND OF THE INVENTION

Methods for bonding semiconductor wafers mechanically have been reported as follows.

The first method has been described on page 495 of "a digest report for a lecture meeting of the 47th applied physical society, 1986", and comprises steps of forming thermal oxide films each having a thickness of 2000 Å on the surfaces of two Si wafers each being $20 \times 20 \times 0.4$ mm$^3$, forming spin-on glass layers each having a thickness of approximately 500 Å on the thermal oxide films of the Si wafers, heating the two Si wafers at the temperature of 300° C. by applying a pressure of 10 kg/cm$^2$ to the bonding surfaces of the spin-on glass layers, and cutting one of the Si wafers off in the reverse epitaxy or the etch back process to provide a silicon on insulator (SOI).

The second method has been described on pages 593 to 595 of the Institute of Electronics Informations and Communications Engineers, Vol. No. 6", and comprises steps of polishing the surfaces of two Si wafers to be mirror planes, cleaning the mirror planes to be activated, and making the activated mirror planes of the two Si wafers in contact with each other in a clean atmosphere to provide a direct bonding of the two Si wafers.

The third method has been described on pages 3118 to 3120 of "J. Appl. Phys. 61(8), 15 April 1987", and comprises steps of depositing a metal thin film on one of two Si wafers to serve as a transport medium for Si atoms from one wafer to another, and heating the two wafers and applying a pressure of a predetermined value thereto, whereby the bonding of Si to Si is realized by solid-phase epitaxy.

In the first to third methods, the two Si wafers having no device formed thereon are bonded mechanically.

However, the first to third methods have a disadvantage in that these methods are difficult to be applied to a method in which semiconductor substrates having circuit elements such as transistors formed thereon are bonded, since adhesive which consists mainly of an insulation material is not utilized for the purpose of bonding the semiconductor substrates electrically, and since the characteristic deterioration and the damage of the circuit elements tends to occur in the step of heating the semiconductor substrates at a high temperature and applying a pressure of a predetermined high value thereto. Further, those methods have a disadvantage in that the curvature, and the expansion and contraction of the semiconductor substrate affect the alignment precision of circuit element patterns, where the semiconductor substrates are bonded in terms of a wafer scale.

SUMMARY OF THE INVENTION

Accordingly, it is an object of the invention to provide a bonding structure of first and second substrates and a method for bonding first and second substrates in which the first and second substrates are bonded electrically.

It is a further object of the invention to provide a bonding structure of first and second substrates and a method for bonding first and second substrates in which adhesive of an insulation material is not necessary to be used.

It is a still further object of the invention to provide a bonding structure of first and second substrates and a method for bonding first and second substrates in which no characteristic deterioration and damage of the circuit elements occurs.

According to a first feature of the invention, a bonding structure of first and second substrates, comprises:

a projection of a high melting point conductive material provided on one plane of the first substrate; and a low melting point conductive material filled in an aperture which is formed on one plane of the second substrate;

wherein the projection and the low melting point conductive material are connected to each other mechanically and electrically, whereby the first and second substrates are bonded on the one planes.

According to a second feature of the invention, a method for bonding first and second substrates, comprises:

providing a projection of a high melting point conductive material on one plane of the first substrate;

forming an aperture being able to accommodate the projection on one plane of the second substrate;

providing a layer of a low melting point conductive material having a predetermined thickness on the bottom plane of the aperture;

aligning the projection of the first substrate and the aperture of the second substrate relative to each other, contacting the first and second substrates on the one planes at a temperature lower than the high melting point and higher than the low melting point, so that the projection is plunged into the low melting point conductive material which is thereby molten; and cooling the first and second substrates at a temperature lower than the low melting point.

BRIEF DESCRIPTION OF THE DRAWINGS

The invention will be explained in more detail in conjunction with appended drawings, wherein:

FIG. 1 is a cross-sectional view showing a bonding structure of semiconductor substrates in a first embodiment according to the invention, FIGS. 2A to 2C are cross-sectional and perspective views showing a method for bonding semiconductor substrates in an embodiment according to the invention, FIGS. 5 and 6 are cross-sectional views showing bonding structures of semiconductor substrates in second and third embodiments according to the invention.

DESCRIPTION OF THE PREFERRED EMBODIMENTS

Figure 3A:
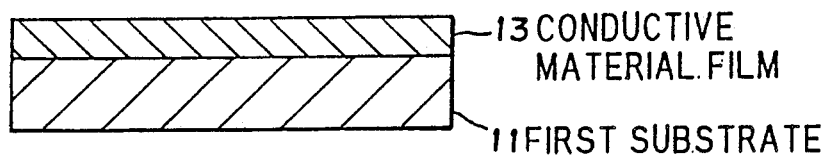
FIGS. 3A to 3E are cross-sectional views showing a fabrication process for a first semiconductor substrate having a conductive material projection to be used in the method for bonding semiconductor substrates.

FIG. 1 shows a bonding structure of semiconductor substrates such as Si wafers in the first embodiment. The bonding structure of semiconductor substrates comprises a first semiconductor substrate 11 on which a projection 12 of a high melting point conductive material such as tungsten is provided, and a second semiconductor substrate 21 on which an aperture 24 partially filled with a low melting point conductive material 22 such as Au-Sn (Au : 80%) alloy is formed. The first and second semiconductor substrates 11 and 21 are bonded each other in accordance with solid phase fixing force between the high melting point conductive material projection 12 and the low melting point conductive material 22.

In bonding the first and second semiconductor substrates 11 and 21, the first semiconductor substrate having the high melting point conductive material projection 12 as shown in FIG. 2A, and the second semiconductor substrate 21 having the aperture 24 filled with the low melting point conductive material 22 as shown in FIG. 2B are prepared beforehand to be explained in more detail later. Next, the first and second semiconductor substrates 11 and 21 are aligned by use of infrared rays transmitting through the first and second semiconductor substrates 11 and 21, such that the projection 12 is positioned over the center of the aperture 24 as shown in FIG. 2C. The projection 12 is of a shape having a width W, and a height H, and the aperture 24 is of a shape having a width $W_2$ ($W_1 > W_2$) and a depth D (H < D). Then, the semiconductor substrates 11 and 21 are heated at the temperature of 450° C. and made contact with each other in the air atmosphere, $N_2$ gas, or mixed gas of $H_2$ and $N_2$ ($H_2$:10-20%), so that the tungsten projection 12 is plunged into the low melting point conductive material 22 of Au-Sn alloy, since the low melting point conductive material 22 becomes liquid phase, and the tungsten projection 12 remains unchanged to be solid phase. In the circumstance, there is no necessity to apply a pressure of a predetermined value to the semiconductor substrates 11 and 21 to be made contact with each other, since the low melting point conductive material 22 of Au-Sn alloy which is in the state of liquid phase has a sufficient fluidity to receive the solid phase projection 12. Thus, the first and second semiconductor substrates 11 and 21 are held at the temperature of 450° C. for one to ten minutes, and then cooled to the room temperature, so that the low melting point conductive material 22 restores solid phase to provide a bonding structure in which the tungsten projection 12 is firmly held by the solid phase low melting point conductive material 22.

The aforementioned first semiconductor substrate 1 is obtained as follows.

Figure 3B:
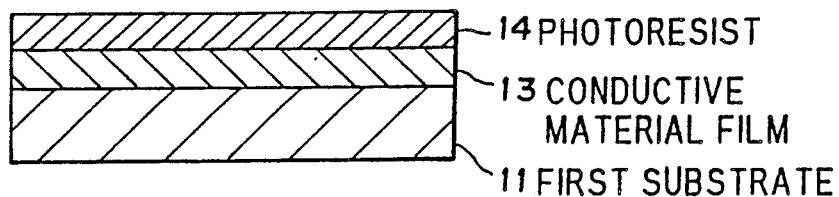
Figure 3C:
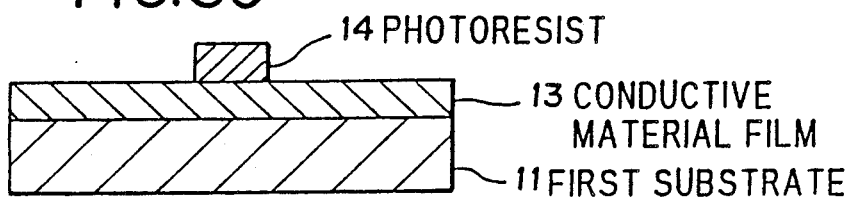
Figure 3D:
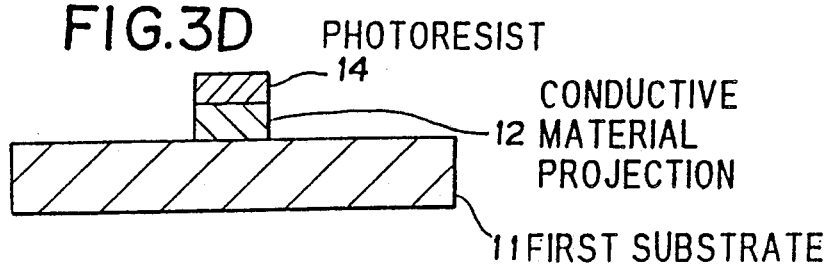
Figure 3E:
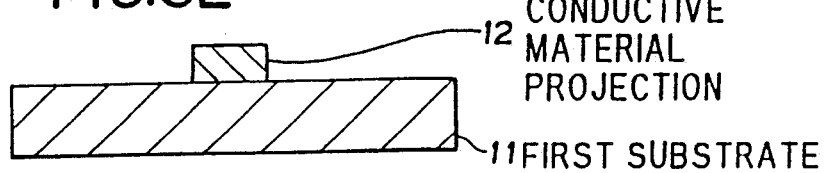

At first, a conductive material film 13 of tungsten is deposited on the first semiconductor substrate 11 by the sputtering method as shown in FIG. A, and a photoresist 14 is spin-coated on the tungsten film 13 as shown in FIG. 3B. The photoresist 14 is exposed to light to provide a mask 14 of a predetermined pattern corresponding to the tungsten projection 12 as shown in FIG. 3C, and the tungsten film 13 is dry-etched in the existence of the mask 14 by the reaction ion-etching utilizing mixed gas of $SF_6$ and $CHF_3$ as shown in FIG. 3D. Finally, the mask 14 is removed to provide the first semiconductor substrate 11 having the tungsten projection 12. As understood from the above, the width $W_1$ of the tungsten projection 12 can be changed by changing a light exposure pattern of the photoresist 14, and the height H of the tungsten projection 12 can be changed by changing the thickness of the tungsten film 13 deposited on the first semiconductor substrate 11 by the sputtering method.

On the other hand, the aforementioned second semiconductor substrate 21 is obtained as follows.

Figure 4A:
FIGS. 4A to 4D are cross-sectional views showing a fabrication process for a second semiconductor substrate having an aperture filled with a low melting point conductive material to be used in the method for bonding semiconductor substrates.
Figure 4B:
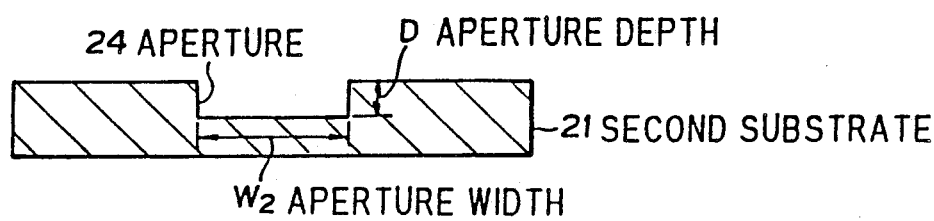
Figure 4C:
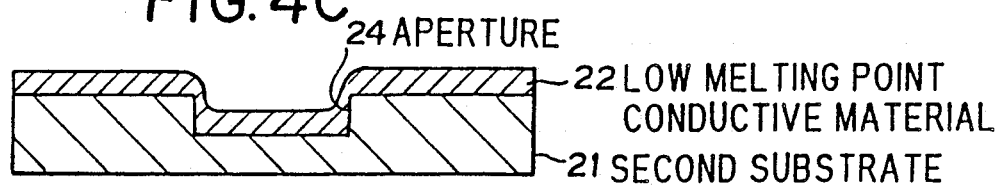
Figure 4D:
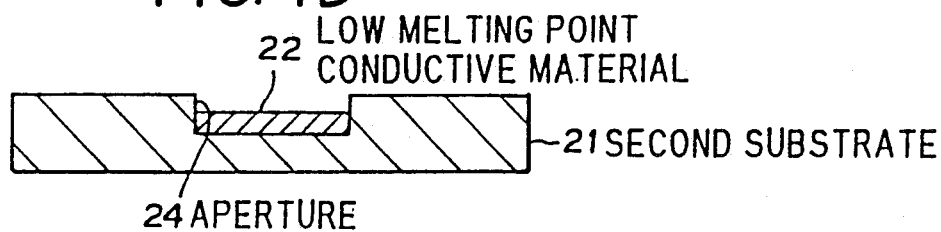

At first, the second semiconductor substrate 21 is prepared as shown in FIG. 4a, and the aperture 24 having the width $W_2$ greater than the width $W_1$ of the tungsten projection 12 and the depth D greater than the height H of the tungsten projection 12 is formed on the second semiconductor substrate 21 by the lithography process and the etching process as shown in FIG. 4B. Thereafter, the low melting point conductive material 22 of Au-Sn alloy is deposited on the second semiconductor substrate 21 by the evaporation or the sputtering method as shown in FIG. 4C. Finally, the Au-Sn alloy layer 22 is removed except for that on the bottom wall of the aperture 24 to provide the second semiconductor substrate 21 having the aperture 24 filled with the Au-Sn alloy 22 by the lithography process and the dry-etching process as shown in FIG. 4D.

FIG. 5 shows a bonding structure of semiconductor substrates in the second embodiment, wherein like parts are indicated by like reference numerals as used in FIG. 1. The bonding structure of semiconductor substrates can be applied to a practical use, even if the first and second semiconductor substrates 11 and 21 are deviated from each other in the horizontal direction, since the aperture width $W_2$ is greater than the projection width $W_1$. For this reason, a yield of a bonding structure of semiconductor substrates is increased.

FIG. 6 shows a bonding structure of semiconductor substrates in the third embodiment, wherein like parts are indicated by like reference numerals as used in FIG. 1. The bonding structure of semiconductor substrates can be fabricated with a stable bonding structure, even if convex (or concave) portions 31 on the facing planes of the semiconductor substrates 11 and 21 prevent them from making contact entirely with each other, since a bonding structure can be realized as long as the projection 12 reaches the low melting point conductive material 22 filled in the aperture 24. For this reason, a vertical tolerance is increased in fabricating a bonding structure of semiconductor substrates, even if a curvature occurs in the first and second semiconductor substrates 11 and 21, as well as in the case of the convex portions 31.

Although tungsten is used for the projection 12 on the first semiconductor substrate 11, it may be replaced by a high melting point metal selected from Ti, Cr, Mo, etc., or by a high melting point silicide or nitride such as $MoSi_x$, TiN, etc. Although Au-Sn alloy is used for the low melting point material 22 filled in the aperture 24 on the second semiconductor substrate 21, it may be replaced by a low melting point material selected from Au-Si alloy, Pb-Sn alloy, In-Sn alloy, etc. Further, the semiconductor substrate 11 and 21 may be a combination of Si substrates, GaAs substrates, and Si and GaAs substrates, etc. Even more, one of these semiconductor substrates may be bonded to a SOI substrate, an insulation substrate such as a glass plate, etc.

As understood from the above, advantages of the invention are listed as follows.

(1) In addition to the mechanical bonding, the transmission of an electric signal can be realized through a signal transmitting path consisting of the projection 12 and the low melting point conductive material 22.

(2) The bonding structure is obtained by a low temperature heating, since the low melting point conductive material 22 is only liquidized.

(3) The semiconductor substrates 11 and 21 can be bonded by use of a low pressure applied thereto, since the projection 12 of solid phase is plunged into the low melting point conductive material 22 of liquid phase.

(4) A horizontal fabricating tolerance is obtained to a practical extent in the reason set forth in the second embodiment.

(5) A vertical fabricating tolerance is obtained to a practical extent in the reason set forth in the third embodiment.

Although the invention has been described with respect to specific embodiment for complete and clear disclosure, the appended claims are not to be thus limited but are to be construed as embodying all modification and alternative constructions that may occur to one skilled in the art which fairly fall within the basic teaching herein set forth.

What is claimed is:

1. A bonding structure of first and second substrates, comprising:
   a projection of a high melting point conductive material selected from a group consisting of W, Cr, Mo, and TiN provided on one plane of said first substrate; and
   a low melting point conductive material selected from a group consisting of Au-Sn, Au-Si, and In-Sn filled in an aperture which is formed on one plane of said second substrate;
   wherein said projection and said low melting point conductive material are connected to each other mechanically and electrically, whereby said first and second substrates come into contact with each other on at least a portion of said one planes.

2. A bonding structure of first and second substrates, according to claim 1, wherein:
   said projection has a first predetermined width and a predetermined height;
   said aperture has a second predetermined width greater than said first predetermined width and a predetermined depth greater than said predetermined height; and
   said low melting point conductive material is filled in said aperture by a predetermined thickness on the bottom wall of said aperture;
   whereby said projection is plunged into said low melting point conductive material, where said first and second substrates come into contact with each other on said one planes.

3. A method for bonding first and second substrates, comprising:
   providing a projection of a high melting point conductive material selected from a group consisting of W, Cr, Mo, and TiN on one plane of said first substrate;
   forming an aperture being able to accommodate said projection on one plane of said second substrate;
   providing a layer of a low melting point conductive material selected from a group consisting of Au-Sn, Au-Si, and In-Sn having a predetermined thickness on the bottom plane of said aperture;
   aligning said projection of said first substrate and said aperture of said second substrate relative to each other,
   said first and second substrates coming into substantially close approximation with each other on said one planes at a temperature which is lower than said high melting point and higher than said low melting point, so that said projection is plunged into said low melting point conductive material while it is molten, said first and second substrates coming into contact with each other on at least a portion of said one planes; and
   cooling said first and second substrates to a temperature lower than said low melting point.

4. A bonding structure comprising:
   first and second substrates;
   a projection of tungsten on one plane of said first substrate; and
   Au-Sn alloy filling an aperture with is formed on one plane of said second substrate;
   said projection and said alloy being mechanically and electrically connected to each other, so that said first and second substrates come into contact with each other in at least a portion of said one planes.

* * * * *